(12) United States Patent
Nagami

(10) Patent No.: US 12,304,029 B2
(45) Date of Patent: May 20, 2025

(54) GRINDING WHEEL

(71) Applicant: DISCO CORPORATION, Tokyo (JP)

(72) Inventor: Masaru Nagami, Tokyo (JP)

(73) Assignee: DISCO CORPORATION, Tokyo (JP)

(*) Notice: Subject to any disclaimer, the term of this patent is extended or adjusted under 35 U.S.C. 154(b) by 339 days.

(21) Appl. No.: 18/053,541

(22) Filed: Nov. 8, 2022

(65) Prior Publication Data

US 2023/0158640 A1    May 25, 2023

(30) Foreign Application Priority Data

Nov. 25, 2021 (JP) .................. 2021-191151

(51) Int. Cl.
*B24D 7/06* (2006.01)
*B24B 7/22* (2006.01)

(52) U.S. Cl.
CPC .............. *B24D 7/066* (2013.01); *B24B 7/228* (2013.01)

(58) Field of Classification Search
CPC . B24D 7/00; B24D 7/06; B24D 7/066; B24D 7/14; B24D 3/00; B24D 3/02; B24D 3/04; B24D 3/14; B24D 3/16; B24D 3/18; B24B 7/228; H01L 21/304; H01L 21/67092
See application file for complete search history.

(56) References Cited

FOREIGN PATENT DOCUMENTS

| JP | 2004238838 A | 8/2004 |
| JP | 2014124690 A | 7/2014 |
| JP | 2014172146 A * | 9/2014 |
| KR | 1020110016256 A | 2/2011 |

OTHER PUBLICATIONS

EESR issued in counterpart European patent application No. EP 22 20 8312, dated Apr. 21, 2023.

* cited by examiner

*Primary Examiner* — C. A. Rivera
(74) *Attorney, Agent, or Firm* — GREER BURNS & CRAIN, LTD.

(57) ABSTRACT

A grinding wheel is mounted on a tip end of a spindle and the grinding wheel grinds a workpiece according to rotation of the spindle. The grinding wheel includes an annular base, and a plurality of grindstone sets disposed in an annular manner on one surface side of the base along a circumferential direction of the base. Each of the plurality of grindstone sets has a first grindstone and a second grindstone having a self-sharpening capability lower than that of the first grindstone, such that the first grindstone and the second grindstone are adjacent to each other in a predetermined orientation in the circumferential direction of the base, and a predetermined interval larger than an interval between the first grindstone and the second grindstone in the circumferential direction of the base is provided between adjacent ones of the grindstone sets.

2 Claims, 11 Drawing Sheets

GRINDING WHEEL

BACKGROUND OF THE INVENTION

Field of the Invention

The present invention relates to a grinding wheel for grinding a workpiece and a grinding method of grinding a workpiece with the grinding wheel.

Description of the Related Art

For thinning semiconductor device chips, in general, after devices such as integrated circuits (ICs) are formed on a front surface side of a wafer that is formed of a semiconductor such as silicon, a back surface side of the wafer is ground with a grinding apparatus. The grinding apparatus includes a disc-shaped chuck table that is rotatable about a predetermined rotational axis. There is disposed a grinding unit above the chuck table. The grinding unit has a spindle with a longitudinal portion substantially parallel to a Z-axis direction (for example, a vertical direction).

A lower end portion of the spindle has an annular-shaped grinding wheel mounted thereon with a disc-shaped mount interposed therebetween. The grinding wheel has an annular-shaped base made of metal. On one surface side (lower surface side) of the base, a plurality of grindstones each having abrasive grains and a bond are disposed at substantially equal intervals along a circumferential direction of the base. When the back surface side of the wafer is ground by infeed grinding, the chuck table that holds under suction the front surface side of the wafer is rotated about a predetermined rotational axis. In addition, while supplying grinding water such as pure water onto the back surface side of the wafer, at the same time, the grinding unit is fed for processing at a predetermined speed, with the spindle rotating the grinding wheel (for example, see Japanese Patent Laid-Open No. 2014-124690).

Meanwhile, a to-be-ground surface of the wafer may be formed with a layer or a film made of a material or a quality different from a material of the wafer. For example, a to-be-ground surface of a silicon carbide (SiC) wafer may be formed with a modified layer in which silicon (Si) and carbon (C) are decomposed. As another alternative, a to-be-ground surface of a silicon wafer may be formed with a silicon oxide film. In this manner, in a case in which a layer or a film made of a material or a quality different from a material of the wafer is formed on the to-be-ground surface of the wafer, in general, a first grinding wheel is used in order to grind the layer or the film described above, and then, after the layer or the film is removed, the second grinding wheel having a characteristic different from that of a first grinding wheel is used in order to grind the wafer.

However, in general, since one grinding unit (in other words, one spindle) has one grinding wheel mounted thereon, two grinding units are required for grinding the wafer by use of the first grinding wheel and the second grinding wheel which have grinding characteristics different from each other.

SUMMARY OF THE INVENTION

However, in a case in which the two grinding apparatuses each having one grinding unit are used to grind a wafer, a step of transferring the wafer between the grinding apparatuses is additionally required, resulting in an increased number of manufacturing steps. Moreover, if two grinding apparatuses are used as described above, footprint for apparatuses in such a room as a clean room is increased. The present invention is achieved in view of these matters, and it is an object of the present invention to perform grinding on a wafer by mounting one grinding wheel on one spindle, the grinding exercising grinding similar to grinding performed by use of two grinding wheels having grinding characteristics different from each other.

In accordance with an aspect of the present invention, there is provided a grinding wheel that is mounted on a tip end of a spindle and grinds a workpiece according to rotation of the spindle, the grinding wheel including an annular base, and a plurality of grindstone sets disposed in an annular manner on one surface side of the base along a circumferential direction of the base. Each of the plurality of grindstone sets has a first grindstone and a second grindstone having a self-sharpening capability lower than that of the first grindstone, such that the first grindstone and the second grindstone are adjacent to each other in a predetermined orientation in the circumferential direction of the base, and a predetermined interval larger than an interval between the first grindstone and the second grindstone in the circumferential direction of the base is provided between adjacent ones of the grindstone sets.

In accordance with another aspect of the present invention, there is provided a grinding method of grinding a workpiece having a single crystal substrate formed with a non-single crystal layer on a front surface of the substrate, with use of the grinding wheel described above. The grinding method includes a holding step of holding under suction, on a chuck table, a back surface of the substrate that is positioned opposite to the front surface of the substrate, a first grinding step of rotating the spindle in a predetermined direction such that the second grindstone is set in front of the first grindstone in each of the grindstone sets, to grind the front surface of the substrate, thereby removing the non-single crystal layer, after the holding step is carried out, and a second grinding step of rotating the spindle in a direction opposite to the predetermined direction such that the first grindstone is set in front of the second grindstone in each of the grindstone sets, to grind the substrate, after the first grinding step is carried out.

In accordance with a further aspect of the present invention, there is provided a grinding method of grinding a workpiece having a substrate formed with a film on a front surface of the substrate, with use of the grinding wheel described above. The grinding method includes a holding step of holding under suction, on a chuck table, a back surface of the substrate that is positioned opposite to the front surface of the substrate, a first grinding step of rotating the spindle in a predetermined direction such that the first grindstone is set in front of the second grindstone in each of the grindstone sets, to grind the film, thereby removing the film, after the holding step is carried out, and a second grinding step of rotating the spindle in a direction opposite to the predetermined direction such that the second grindstone is set in front of the first grindstone in each of the grindstone sets, to grind the substrate, after the first grinding step is carried out.

With use of the grinding wheel according to an embodiment of the present invention, the grinding characteristic can be changed between grinding in which the spindle is rotated in a predetermined direction such that the second grindstone is set in front of the first grindstone in each of the grindstone sets, and grinding in which the spindle is rotated in a direction opposite to the predetermined direction such that the first grindstone is set in front of the second grindstone in each of the grindstone sets. In other words, changing the rotational direction of one spindle makes it possible to grind the workpiece with a different grinding characteristic. Hence, with one grinding wheel mounted on one spindle, grinding similar to grinding performed by use of two grinding wheels having the grinding characteristics different from each other can be performed on the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
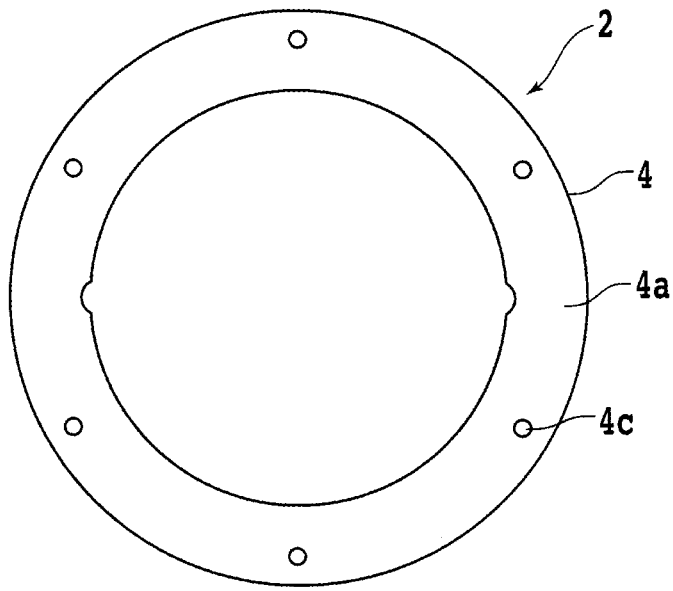
FIG. 1A is a top view of a grinding wheel according to a first embodiment of the present invention.
Figure 1B:
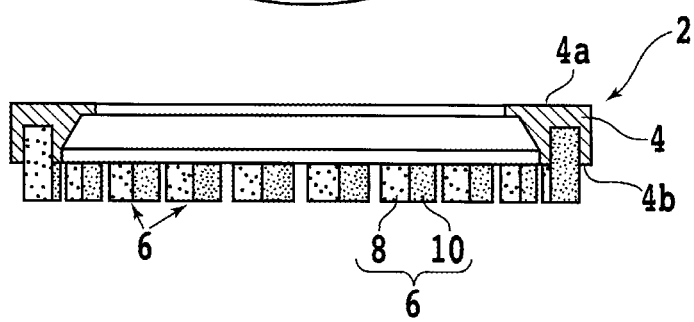
FIG. 1B is a cross-sectional view of the grinding wheel of FIG. 1A.
Figure 1C:
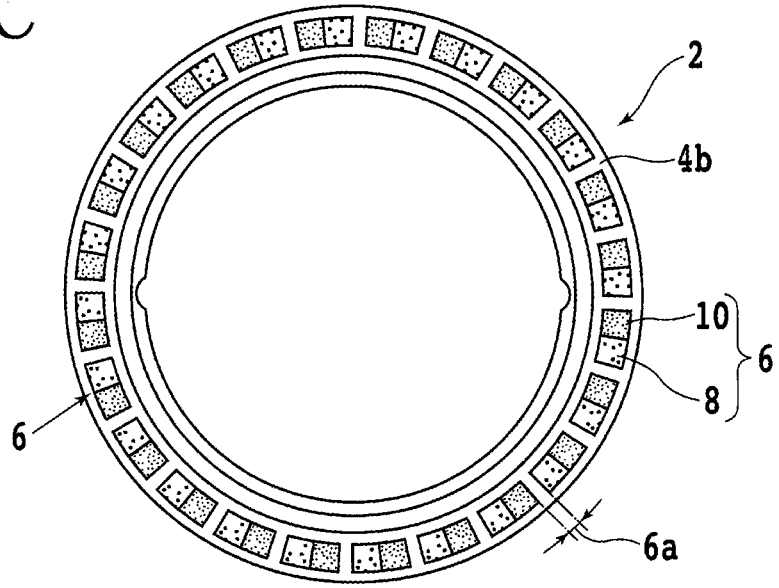
FIG. 1C is a bottom view of the grinding wheel of FIG. 1A.

Hereinafter, embodiments of the present invention will be described with reference to the accompanying drawings. FIG. 1A is a top view of a grinding wheel 2. FIG. 1B is a cross-sectional view of the grinding wheel 2. FIG. 1C is a bottom view of the grinding wheel 2. The grinding wheel 2 has an annular base 4 formed of metal such as an aluminum alloy. For example, an outer diameter of the base 4 is 200 mm, but the outer diameter of the base 4 is appropriately selectable according to a purpose of grinding, for example.

The base 4 has an upper surface (other surface) 4a and a lower surface (one surface) 4b, and each surface is substantially flat, having an annular shape. The upper surface 4a has a plurality of threaded holes 4c formed therein at substantially equal intervals along a circumferential direction of the base 4, and the threaded holes 4c are used at a time of mounting the grinding wheel 2 on a mount 28 illustrated in FIG. 2. Note that an inner side surface in a truncated conical shape of the base 4 located on the inner peripheral side relative to the lower surface 4b may be provided with a plurality of openings (not illustrated) each for supplying grinding water such as pure water, along the circumferential direction of the base 4 at substantially equal intervals.

As illustrated in FIG. 1C, on the lower surface 4b of the base 4, a plurality of grindstone sets 6 are disposed in an annular manner along the circumferential direction of the base 4 at substantially equal intervals. Although 24 grindstone sets 6 are disposed in FIG. 1C, the number of grindstone sets 6 is not limited to 24. As illustrated in FIG. 1B, one grindstone set 6 has a first grindstone 8 and a second grindstone 10, each grindstone having a segment shape. An upper end portion of each of the first grindstone 8 and the second grindstone 10 is disposed in a groove portion formed on the lower surface 4b side of the base 4 and is fixed to the base 4 via an adhesive (not illustrated). In addition, each of the first grindstone 8 and the second grindstone 10 has a lower end portion protruding from the lower surface 4b in such a manner that the lower end portion is equivalent to a predetermined protruding amount (also referred to as a segment height). The protruding amounts of the first grindstone 8 and the second grindstone 10 are substantially the same.

The first grindstones 8 and the second grindstones 10 are formed of the same materials and have abrasive grains with the same grain size (for example, diamond abrasive grains), and concentration of the abrasive grains is substantially same in the first grindstone 8 and the second grindstone 10, for example, while a material of a bond and porosity are different between the first grindstone 8 and the second grindstone 10. In the present specification, the first grindstone 8 is relatively soft, and the second grindstone 10 is harder than the first grindstone 8. A hardness of the grindstones can be evaluated by a three-point bend test, for example. A bending strength of the second grindstone 10 is two or more times greater than that of the first grindstone 8.

A hardness of the grindstone is attributable to a material of the bond, for example. In a case in which the bond of the first grindstone 8 is a resin bond and the bond of the second grindstone 10 is a vitrified bond, a hardness of the second grindstone 10 is greater than that of the first grindstone 8. In addition, for example, the hardness of the grindstone is attributable to its porosity. In a case in which the bond of the first grindstone 8 and the bond of the second grindstone 10 are both vitrified bonds of substantially the same components and porosity of the first grindstone 8 is higher than that of the second grindstone 10, the hardness of the second grindstone 10 is greater than that of the first grindstone 8.

Moreover, similarly, in a case in which the bond of the first grindstone 8 and the bond of the second grindstone 10 are both resin bonds of substantially the same components and the porosity of the first grindstone 8 is higher than porosity of the second grindstone 10, the hardness of the second grindstone 10 is greater than that of the first grindstone 8. In this manner, in a case in which the hardness of the second grindstone 10 is greater than that of the first grindstone 8, a force of fixing the abrasive grains by, for example, the bond of the second grindstone 10 (i.e., a bonding force) is greater than the bonding force of the bond of the first grindstone 8. Due to a difference between these bonding forces described above, a self-sharpening capability of the first grindstone 8 that is relatively soft is relatively high, and a self-sharpening capability of the second grindstone 10 that is relatively hard is lower than that of the first grindstone 8.

In one grindstone set 6, the first grindstone 8 and the second grindstone 10 are disposed in the circumferential direction of the base 4 so as to be oriented in a predetermined direction. In the bottom view illustrated in FIG. 1C, in one grindstone set 6, the first grindstone 8 and the second grindstone 10 are disposed in such a manner that an orientation advancing from the second grindstone 10 to the first grindstone 8 is set clockwise. However, in a case in which the grinding wheel 2 is similarly viewed from the bottom of the grinding wheel 2, in one grindstone set 6, the first grindstone 8 and the second grindstone 10 may be disposed in such a manner that an orientation advancing from the first grindstone 8 to the second grindstone 10 is set clockwise.

As illustrated in FIG. 1C, in one grindstone set 6, the first grindstone 8 and the second grindstone 10 are provided so as to be adjacent to each other. The first grindstone 8 and the second grindstone 10 of the present embodiment are substantially in contact with each other; however, they may be adjacent to each other to such an extent that there can be provided a small gap between the first grindstone 8 and the second grindstone 10 in the circumferential direction of the base 4. In this case, the small gap between the first grindstone 8 and the second grindstone 10 in the circumferential direction of the base 4 is sufficiently smaller than a predetermined interval 6a between two grindstone sets 6 adjacent to each other in the circumferential direction of the base 4, for example.

The interval between the first grindstone 8 and the second grindstone 10 in the circumferential direction of the base 4 is ⅓ or smaller than the predetermined interval 6a, preferably ¼ or smaller than the predetermined interval 6a. For example, the interval between the first grindstone 8 and the second grindstone 10 in the circumferential direction of the base 4 is 1 mm or smaller. In addition, for example, the first grindstone 8 and the second grindstone 10 are close to each other to such an extent that the abrasive grains protruding from a side surface of the first grindstone 8 adjacent to the second grindstone 10 are in contact with the second grindstone 10 or that the abrasive grains protruding from a side surface of the second grindstone 10 adjacent to the first grindstone 8 are in contact with the first grindstone 8.

As described above, the predetermined interval 6a is provided between adjacent ones of the grindstone sets 6, and the predetermined interval 6a is larger than the small gap between the first grindstone 8 and the second grindstone 10 in the circumferential direction of the base 4. The predetermined interval 6a along the circumferential direction of the base 4 is a predetermined value of 3.0 mm or more but 4.0 mm or less, for example, and the predetermined interval 6a is appropriately adjusted, depending on the numbers of the first grindstone 8 and the second grindstone 10, each size of the first grindstone 8 and the second grindstone 10, and the like.

The first grindstones 8 and the second grindstones 10 are formed separately after the bond, the abrasive grains, a filler, and the like are first mixed and the mixture is subsequently subjected to compression molding, baking, and shaping, for example. As the abrasive grains, what is generally called superabrasive grains such as diamond or cubic boron nitride (cBN) are used. After shaping, in such a manner as to achieve the layout illustrated in FIG. 1A to FIG. 1C, the first grindstones 8 and the second grindstones 10 are fixed to the base 4 via the adhesive. The grinding wheel 2 manufactured in this manner is used in a grinding apparatus 12 which grinds a workpiece 11 (see FIG. 5 or the like).

Figure 2:
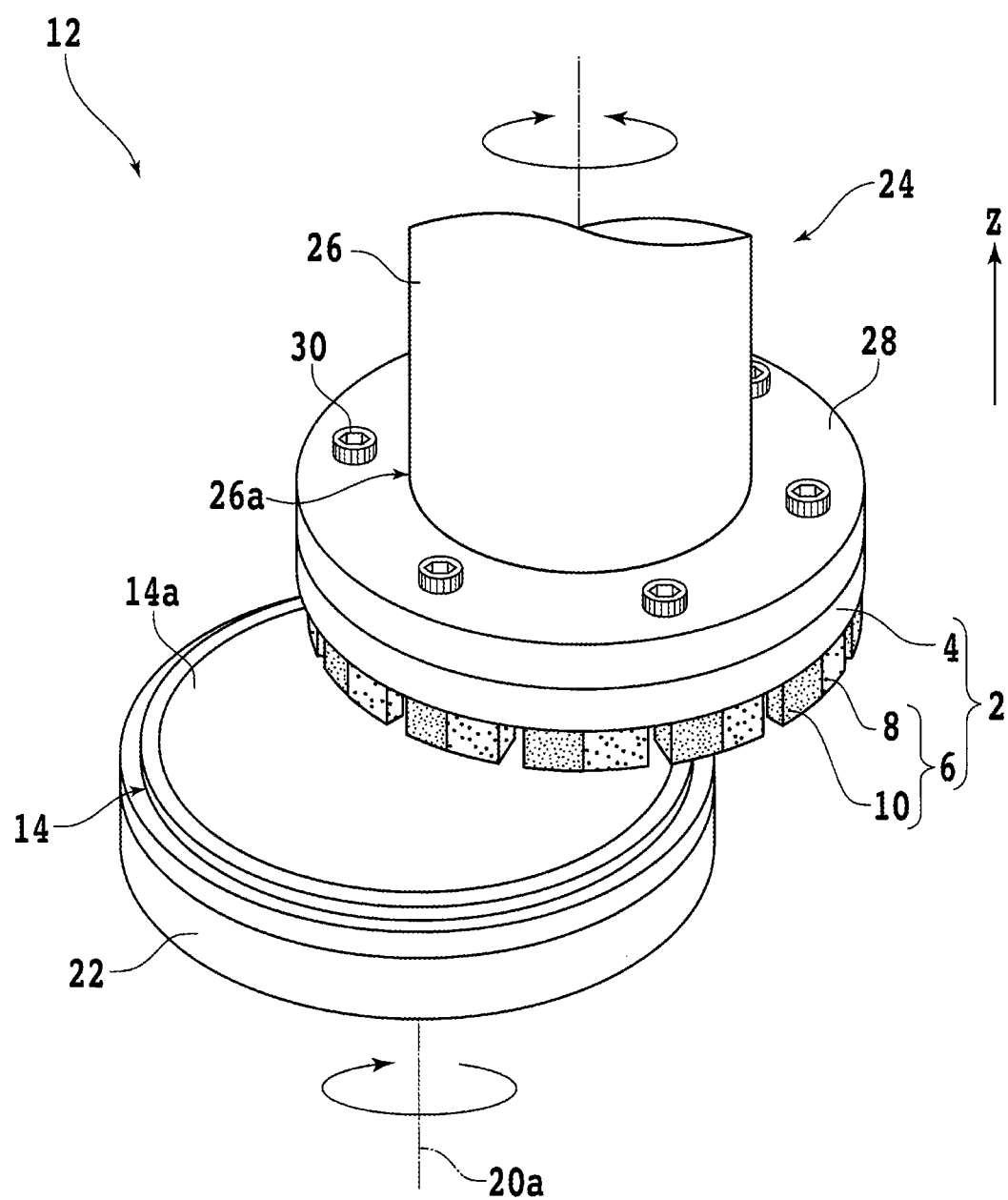
FIG. 2 is a perspective view of a grinding apparatus.

FIG. 2 is a perspective view of the grinding apparatus 12. Note that FIG. 2 illustrates a main portion of the grinding apparatus 12 and for the convenience of description, illustration of other constituent elements is omitted. In addition, a Z-axis direction illustrated in FIG. 2 is parallel to a vertical direction, for example. The grinding apparatus 12 has a circular disc-shaped chuck table 14. The chuck table 14 has a circular disc-shaped frame member 16 (see FIG. 5) that is formed of non-porous ceramics. An upper portion of the frame member 16 has a circular disc-shaped recess formed therein, and this recess has a circular disc-shaped porous plate 18 (see FIG. 5) formed of porous ceramics fixed thereto.

The frame member 16 has a gas flow path 16a (see FIG. 5) formed therein, and the gas flow path 16a has one end portion connected to a suction source such as an ejector (not illustrated). A negative pressure from the suction source is transmitted through the gas flow path 16a to the porous plate 18. An upper surface of the frame member 16 and an upper surface of the porous plate 18 are substantially flush with each other, and they function as a holding surface 14a for holding under suction the workpiece 11. A central portion of the porous plate 18 protrudes more than the peripheral portion, and the holding surface 14a is a conical shape. However, a protruding amount of the central portion of the porous plate 18 is much smaller than a diameter of the holding surface 14a. For example, whereas the protruding amount of the central portion of the porous plate 18 is 20 μm, the diameter of the holding surface 14a is 200 mm. In view of this, in FIG. 5, for the convenience of description, the holding surface 14a is illustrated to be substantially flat.

A lower portion of the chuck table 14 has a rotational axis 20 (see FIG. 5) provided therein, the rotational axis 20 being cylindrical. The rotational axis 20 is rotated in a predetermined direction by a driving mechanism such as a pulley and a belt (not illustrated). In FIG. 2, a rotational center 20a of the rotational axis 20 is indicated with a one-dot chain line. The chuck table 14 is supported by a table base 22 in a rotatable manner. A lower portion of the table base 22 has an inclination adjusting mechanism (not illustrated) provided therein, the inclination adjusting mechanism for adjusting inclination of the table base 22.

The inclination adjusting mechanism has a first supporting portion, a second supporting portion, and a third supporting portion. A length of the first supporting portion in the Z-axis direction is fixed, while lengths of the second supporting portion and the third supporting portion in the Z-axis direction can separately be changed. The first to third supporting portions are disposed at substantially equal intervals in a circumferential direction of the table base 22 to support the table base 22 in three points.

On the periphery of the chuck table 14, an inner nozzle (not illustrated) for supplying grinding water onto a contact region (processing region) between the grinding wheel 2 and the workpiece is provided. In the present embodiment, inner edge grinding in which the workpiece is ground on an inner circumferential side of the grindstones is performed, and accordingly, an inner nozzle for supplying the grinding water on the inner circumferential side of the grindstones is used. Alternatively, the grinding water may be supplied from the openings provided in the base 4. Note that, in a case in which an outer edge grinding in which the workpiece is ground on an outer circumferential side of the grindstones is performed, an outer nozzle (not illustrated) for supplying the grinding water on the outer circumferential side of the grindstones may be used.

Above the chuck table 14, there is provided a grinding unit 24. The grinding unit 24 has a cylindrical spindle housing (not illustrated). The spindle housing has a Z-axis direction moving unit of ball-screw type (not illustrated) mounted thereto. The Z-axis direction moving unit can vertically move the spindle housing in the Z-axis direction. For example, at a time of grinding, the Z-axis direction moving unit moves the grinding unit 24 downward (i.e., processing-feeds) at a predetermined processing-feeding speed.

The spindle housing houses part of a cylindrical spindle 26 in a rotatable manner. On the periphery of an upper end portion of the spindle housing, there is provided a driving source (not illustrated), such as a motor, for rotating the spindle 26. According to an orientation of current supplied to the driving source, the spindle 26 can rotate in both clockwise and counterclockwise directions. A lower end portion (tip end portion) 26a of the spindle 26 protrudes from the spindle housing.

The lower end portion 26a has an upper surface of a circular disc-shaped mount 28 fixed thereto. On a lower surface side of the mount 28, the grinding wheel 2 described above is mounted with a plurality of bolts 30. In this manner, the lower end portion 26a has the grinding wheel 2 mounted thereto with the mount 28 interposed therebetween. As a result of rotation of the spindle 26, the grinding wheel 2 rotates, and accordingly, a rotational trajectory of the lower surface of each of the first grindstone 8 and the second grindstone 10 forms an annular grinding surface.

Figure 3:
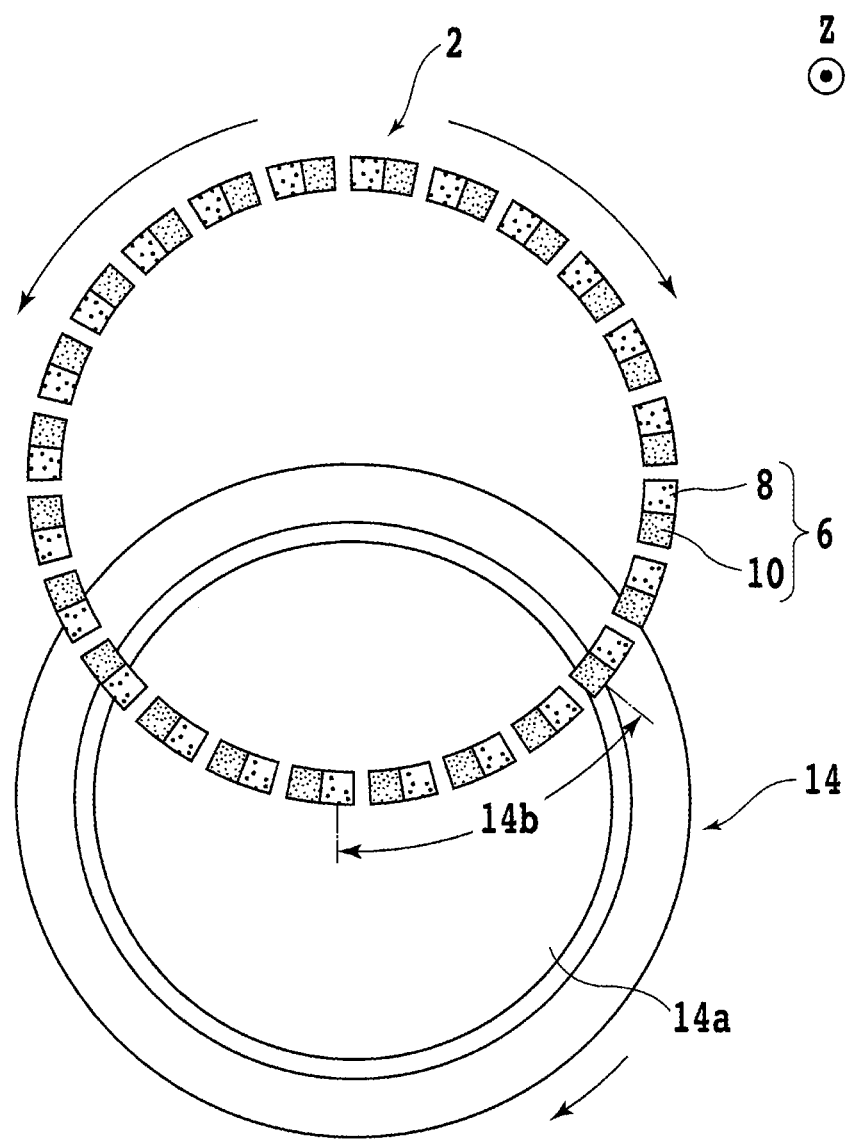
FIG. 3 is a top view illustrating a chuck table and other constituent elements.

The rotational axis 20 of the chuck table 14 is inclined in such a manner that a partial region 14b of the holding surface 14a (see FIG. 3) is substantially parallel to the grinding surface. The partial region 14b is an arc-shaped region passing a center of the holding surface 14a. The partial region 14b is located directly below the plurality of grindstone sets 6, and in FIG. 3, a range of the partial region 14b is indicated with a double-headed arrow. At a time of grinding, of the workpiece 11 held under suction on the holding surface 14a, the region corresponding to this partial region 14b is ground (i.e., becomes a processing region). FIG. 3 is a top view of the chuck table 14 and other constituent elements. Note that, in FIG. 3, only the plurality of grindstone sets 6 of the grinding unit 24 located on the holding surface 14a are indicated in addition to the chuck table 14.

Figure 4:
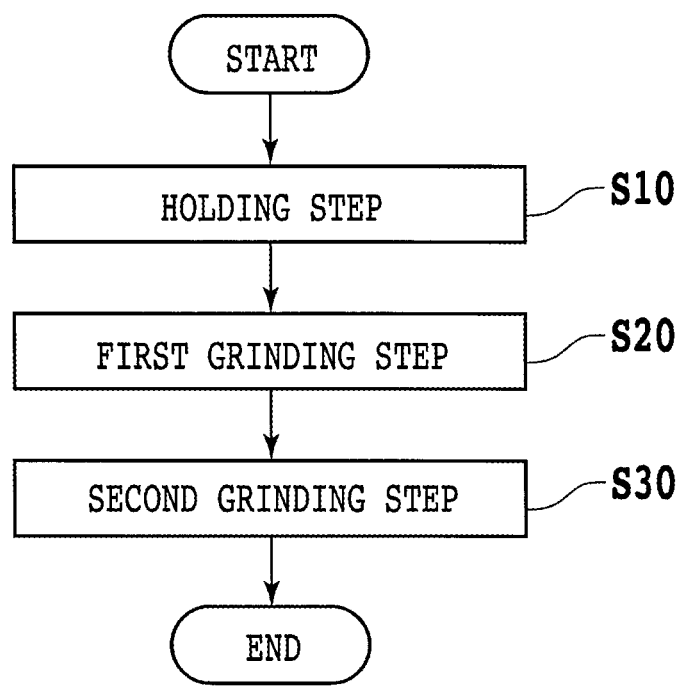
FIG. 4 is a flow chart of a grinding method according to the first embodiment of the present invention.

Next, with reference to FIG. 4 to FIG. 7B, a grinding method of the first embodiment of the present invention will be described. FIG. 4 is a flow chart of a grinding method according to the first embodiment of the present invention. In the first embodiment, in the order of a holding step S10, a first grinding step S20, and a second grinding step S30, infeed grinding is carried out on the workpiece 11. The workpiece 11 has a circular disc shape, and has a single crystal substrate (the wafer) 13 mainly formed of silicon carbide (Sic).

When the workpiece 11 is formed, first, a laser beam is focused on an SiC ingot at a predetermined depth to form an amorphous region (also referred to as a modified region, a separation region, or the like). In the amorphous region, amorphous carbon (C) and amorphous silicon (Si) are considered to be formed. After the amorphous region is formed, a substrate 13 is separated from the ingot with the amorphous region as a boundary. As a result, a front surface 13a of the substrate 13 separated from the ingot has an amorphous layer (non-single crystal layer) 15 formed therein. Note that the front surface 13a of the substrate 13 having been separated has an arithmetic mean roughness Ra of substantially 80 μm to 100 μm, for example.

Figure 5:
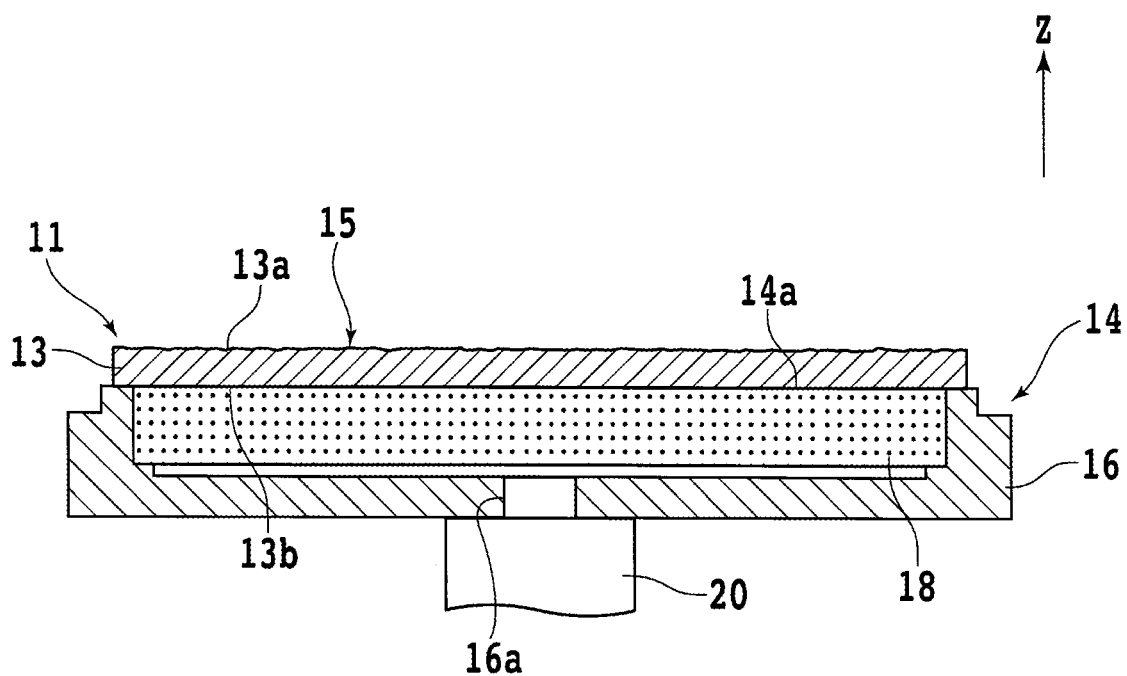
FIG. 5 is a diagram illustrating a holding step of the grinding method of FIG. 4.
Figure 6A:
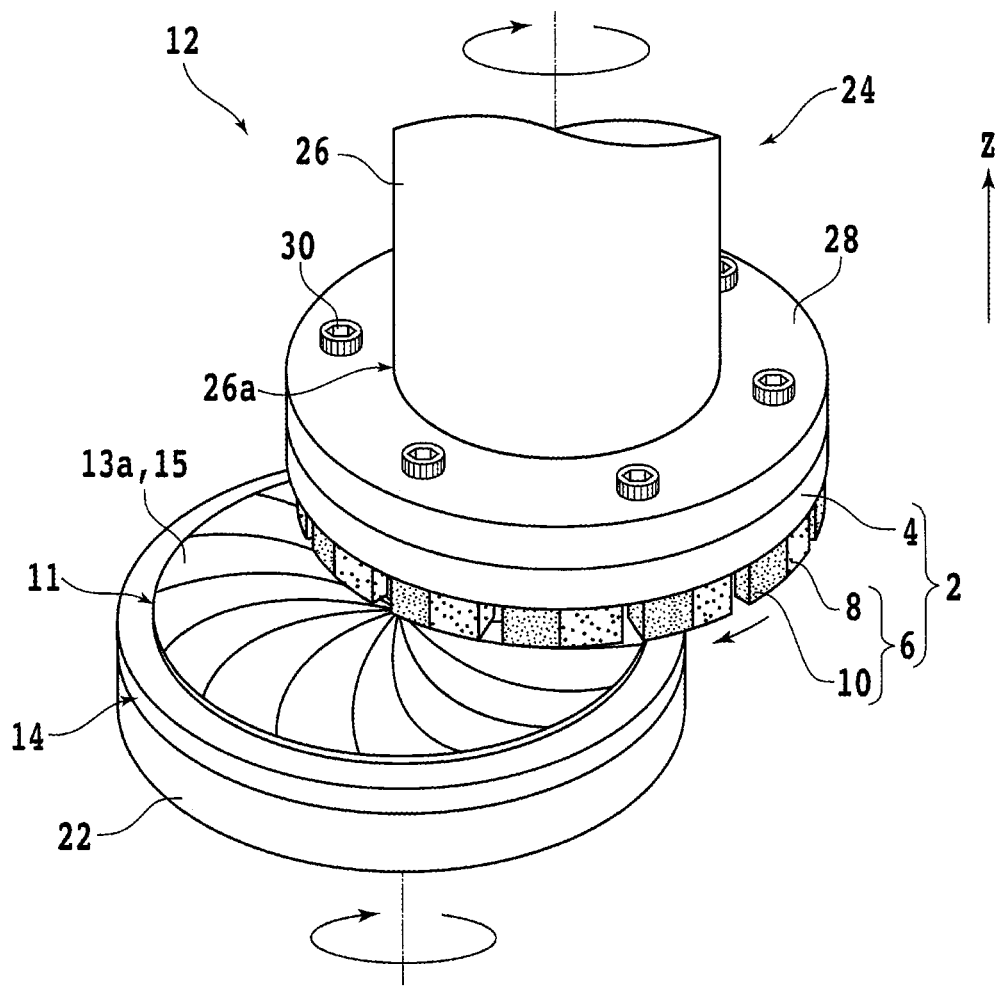
FIG. 6A is a diagram illustrating a first grinding step of the grinding method of FIG. 4.

When the workpiece 11 is ground, first, a back surface 13b side of the substrate 13 located on an opposite side of the front surface 13a is held under suction on the holding surface 14a of the chuck table 14 (holding step S10). FIG. 5 is a diagram illustrating the holding step S10. Subsequent to the holding step S10, the first grinding step S20 is carried out. FIG. 6A is a diagram illustrating the first grinding step S20. In the first grinding step S20, to remove the amorphous layer 15, mainly with use of the second grindstone 10 being relatively hard and having a low self-sharpening capability, the front surface 13a side of the substrate 13 is ground.

In the first grinding step S20, the chuck table 14 is rotated at a predetermined value of 100 rpm or higher but 300 rpm or less in a predetermined direction, and the spindle 26 is rotated at a predetermined value of 1000 rpm or higher but 4000 rpm or less in a predetermined direction. At the same time, while supplying the grinding water to a processing point along with these rotational operations of the chuck table 14 and the spindle 26, the grinding unit 24 is fed for grinding at a predetermined processing feeding speed of 0.1 μm/s or higher but 2.0 μm/s or less. Particularly, in the first grinding step S20, the spindle 26 and the grinding wheel 2 are rotated in a predetermined direction in such a manner that the second grindstone 10 is set in front of the first grindstone 8 in each of the grindstone sets 6.

Figure 6B:
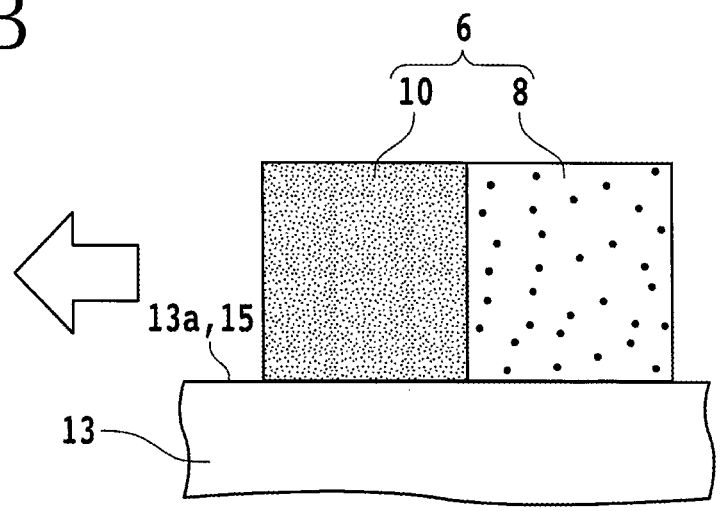
FIG. 6B is a cross-sectional view of a partly enlarged portion of FIG. 6A, in the first grinding step.

FIG. 6B is a cross-sectional view of a partly enlarged portion of FIG. 6A, in the first grinding step S20. As indicated in FIG. 6B, in the first grinding step S20, mainly with use of the second grindstone 10 of each of the grindstone sets 6, the front surface 13a side of the substrate 13 is ground. Accordingly, it is possible to carry out grinding on which a grinding characteristic of the second grindstone 10 is reflected. Specifically, it is possible to grind the front surface 13a side of the substrate 13, while achieving reduction in wear amount of the grindstone. Note that, in the first grinding step S20, the first grindstone 8 being relatively soft and having a high self-sharpening capability only traces the front surface 13a having ground by the second grindstone 10. As a result, the wear amount of the first grindstone 8 is substantially the same as the wear amount of the second grindstone 10. In this manner, in the first grinding step S20, it is possible to grind the workpiece 11, relatively reducing the wear amounts of the grindstones. In the first grinding step S20, the front surface 13a side of the substrate 13 is ground until the amorphous layer 15 is removed and the substrate 13 is then exposed.

Subsequent to the first grinding step S20, the second grinding step S30 is carried out. The single crystal substrate 13 is harder than the region of the amorphous layer 15. When this hard substrate 13 is ground, glazing and shedding of the grindstones are likely to occur. To address this problem, in order to grind the substrate 13 stably, there is a need to proceed grinding while promoting self-sharpening of the grindstones. In the second grinding step S30, the first grindstone 8 being relatively soft and having a high self-sharpening capability is effectively used to grind the substrate 13.

First, in the second grinding step S30, the grinding unit 24 is raised to such an extent that the first grindstone 8 and the second grindstone 10 are not in contact with the workpiece 11. Note that a rotational direction and a rotational speed of the chuck table 14 are maintained at the same rotational direction and the same rotational speed in the first grinding step S20. Then, in such a manner that the first grindstone 8 is set in front of the second grindstone 10 in each of the grindstone sets 6, the spindle 26 and the grinding wheel 2 are rotated at a predetermined value of 1000 rpm or higher but 4000 rpm or less in a direction opposite to the predetermined direction in the first grinding step S20. Subsequently, while rotating the spindle 26 and supplying the grinding water to the processing point, the grinding unit 24 is fed for grinding at a processing feeding speed of a predetermined value of 0.1 µm/s or higher but 2.0 µm/s or less.

Figure 7A:
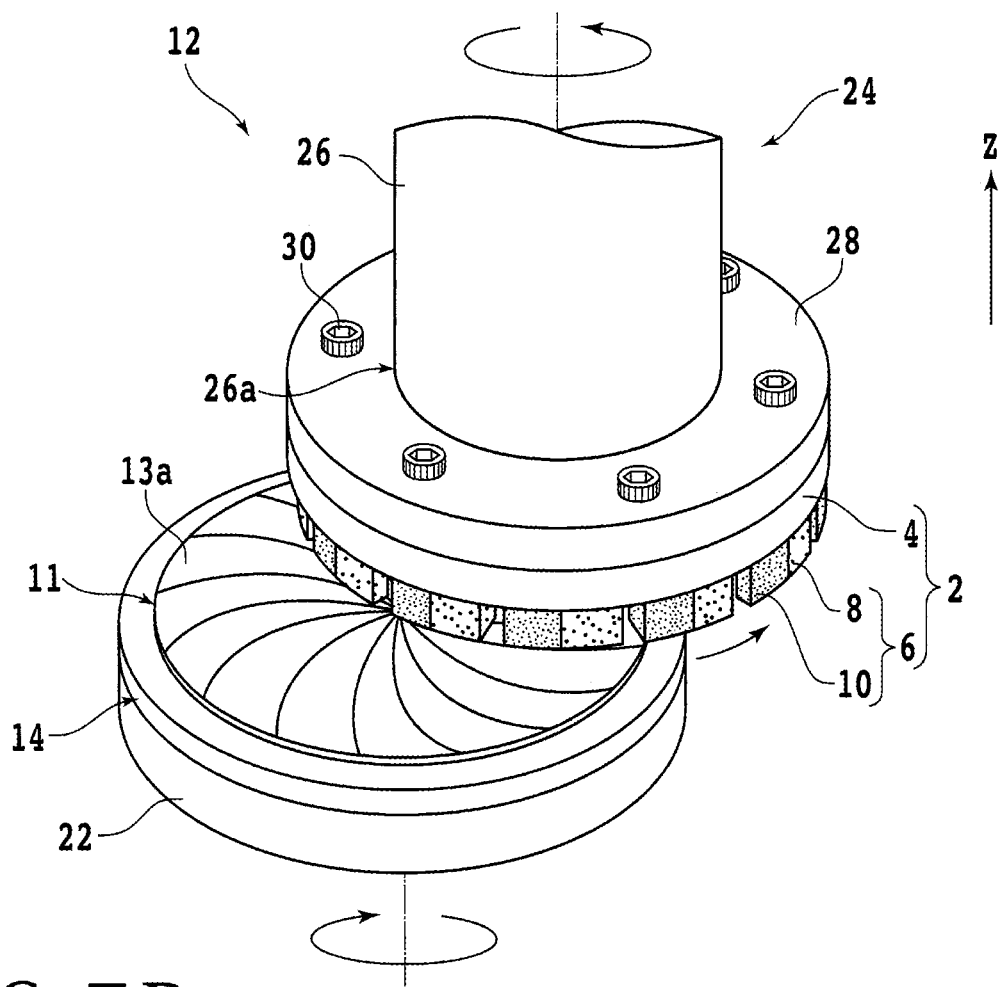
FIG. 7A is a diagram illustrating a second grinding step of the grinding method of FIG. 4.

FIG. 7A is a diagram illustrating the second grinding step S30 of the grinding method of FIG. 4. In the second grinding step S30, it is possible to perform grinding on which a grinding characteristic of the first grindstone 8 is reflected. Specifically, it is possible to perform grinding on which a high self-sharpening capability is reflected. In addition, some abrasive grains 8b falling off a bond 8a of the first grindstone 8 enter the lower surface (grinding surface) of the second grindstone 10, so that self-sharpening of the second grindstone 10 being relatively hard and having a low self-sharpening capability is promoted.

Figure 7B:
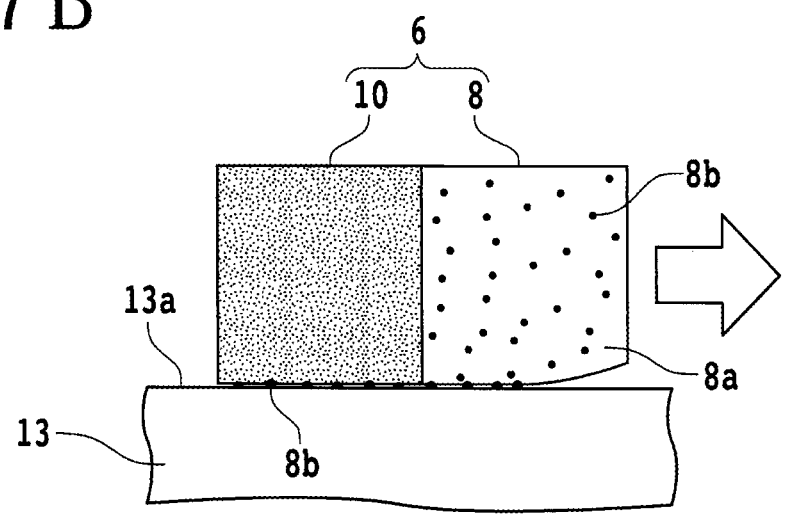
FIG. 7B is a cross-sectional view of a partly enlarged portion of FIG. 7A, in the second grinding step.

FIG. 7B is a cross-sectional view of a partly enlarged portion of FIG. 7A, in the second grinding step S30. As indicated in FIG. 7B, in the second grinding step S30, some abrasive grains 8b falling off can promote self-sharpening of the second grindstone 10. As a result, the first grindstone 8 and the second grindstone 10 are substantially the same in wear amount with each other. In this manner, in the second grinding step S30, while each wear amount of the first grindstone 8 and the second grindstone 10 is increased more than that in the first grinding step S20, the workpiece 11 is ground to grind the substrate 13 until the substrate 13 has a predetermined finished thickness.

In the first embodiment, with use of one grinding wheel 2 mounted on one spindle 26, according to the rotational direction of the spindle 26, grinding is achieved such that the wear amounts of the grindstones are reduced in the first grinding step S20. In addition, in the second grinding step S30, it is possible to exercise a high self-sharpening capability. In this manner, it is possible to change a grinding characteristic according to a rotational direction of the spindle 26. In other words, according to a rotational direction of the spindle 26, it is possible to perform grinding, on the workpiece 11, similar to grinding performed by use of two grinding wheels having grinding characteristics different from each other. Hence, it is possible to prevent an additional transferring step between the grinding apparatuses and an increase in footprint of the grinding apparatuses. Note that, since the plurality of grindstone sets 6 are disposed in an annular manner along the circumferential direction of the base 4, regardless of the rotational direction of the spindle 26, an inner diameter and an outer diameter of the grinding surface of the grinding wheel 2 are allowed to be substantially the same.

Meanwhile, according to an experiment having conducted by the present applicant, in a case in which the wear amount of each of the first grindstone 8 and the second grindstone 10 in the first grinding step S20 is set to 1, the wear amount of each of the first grindstone 8 and the second grindstone 10 in the second grinding step S30 was 1.5.

Comparative Experiment

In contrast to this result, with use of a grinding wheel in which the first grindstones 8 and the second grindstones 10 are alternately disposed in an annular manner at a predetermined interval of 3.0 mm or more but 4.0 mm or less along the circumferential direction of the base 4, a comparative experiment in which one surface of the workpiece is ground has been conducted. In the comparative experiment, a first step in which the grinding wheel is rotated in a predetermined direction to grind the workpiece and a second step in which the grinding wheel is rotated in a direction opposite to the predetermined direction to grind the workpiece were substantially the same in wear amount of each of the first grindstones 8 and the second grindstones 10. Hence, in order to change the grinding characteristic according to a rotational direction, it can be said that an interval between the first grindstone 8 and the second grindstone 10 constituting one grindstone set 6 in the circumferential direction of the base 4 is required to be made smaller than an interval between adjacent ones of the grindstone sets 6 in the circumferential direction of the base 4.

Figure 8:
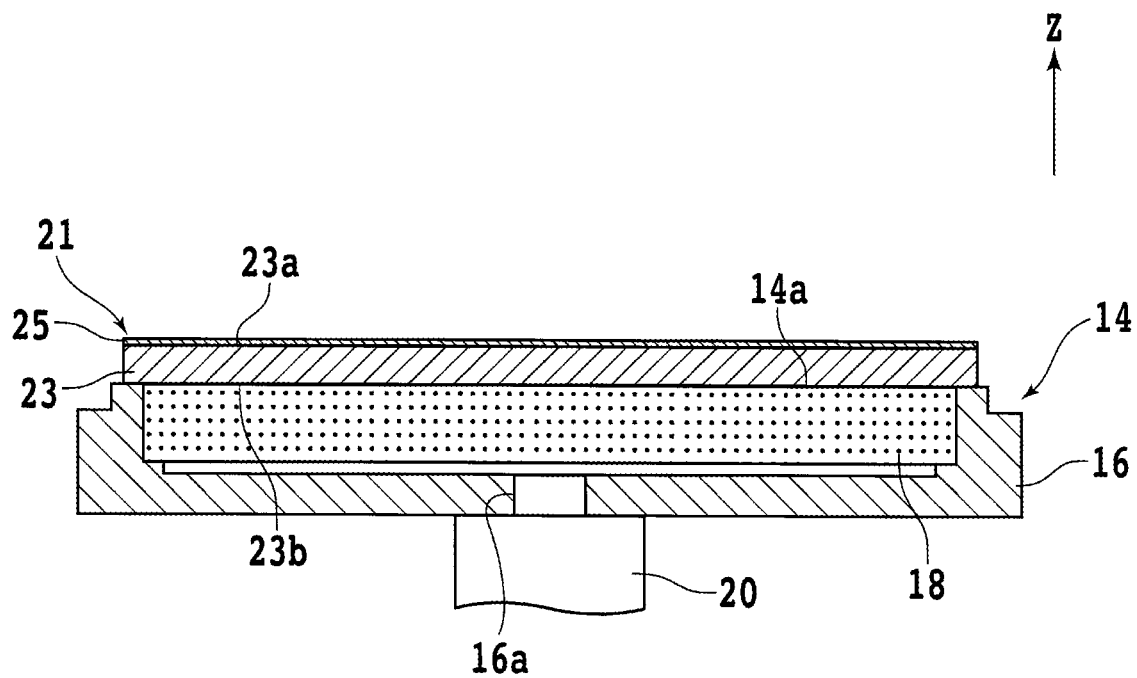
FIG. 8 is a diagram illustrating a holding step according to a grinding method of a second embodiment of the present invention.

Next, the second embodiment will be described. In the second embodiment, with use of the grinding apparatus 12 mounted thereon with the grinding wheel 2 described above, a workpiece 21 (see FIG. 8) is ground according to the flow chart of the grinding method indicated in FIG. 4. As illustrated in FIG. 8, the workpiece 21 has a single crystal substrate (the wafer) 23 mainly formed of silicon. The substrate 23 has a disc shape and has a film 25 formed on a front surface 23a of the substrate 23, the film 25 being formed of such a material different from the substrate 23 as silicon oxide (for example, $SiO_2$) film, silicon nitride (for example, $Si_3N_4$) film, or a metal film. When the workpiece 21 is ground, first, the back surface 23b of the substrate 23 positioned on an opposite side of the front surface 23a thereof is held under suction on the holding surface 14a of the chuck table 14 (holding step S10).

Figure 9:
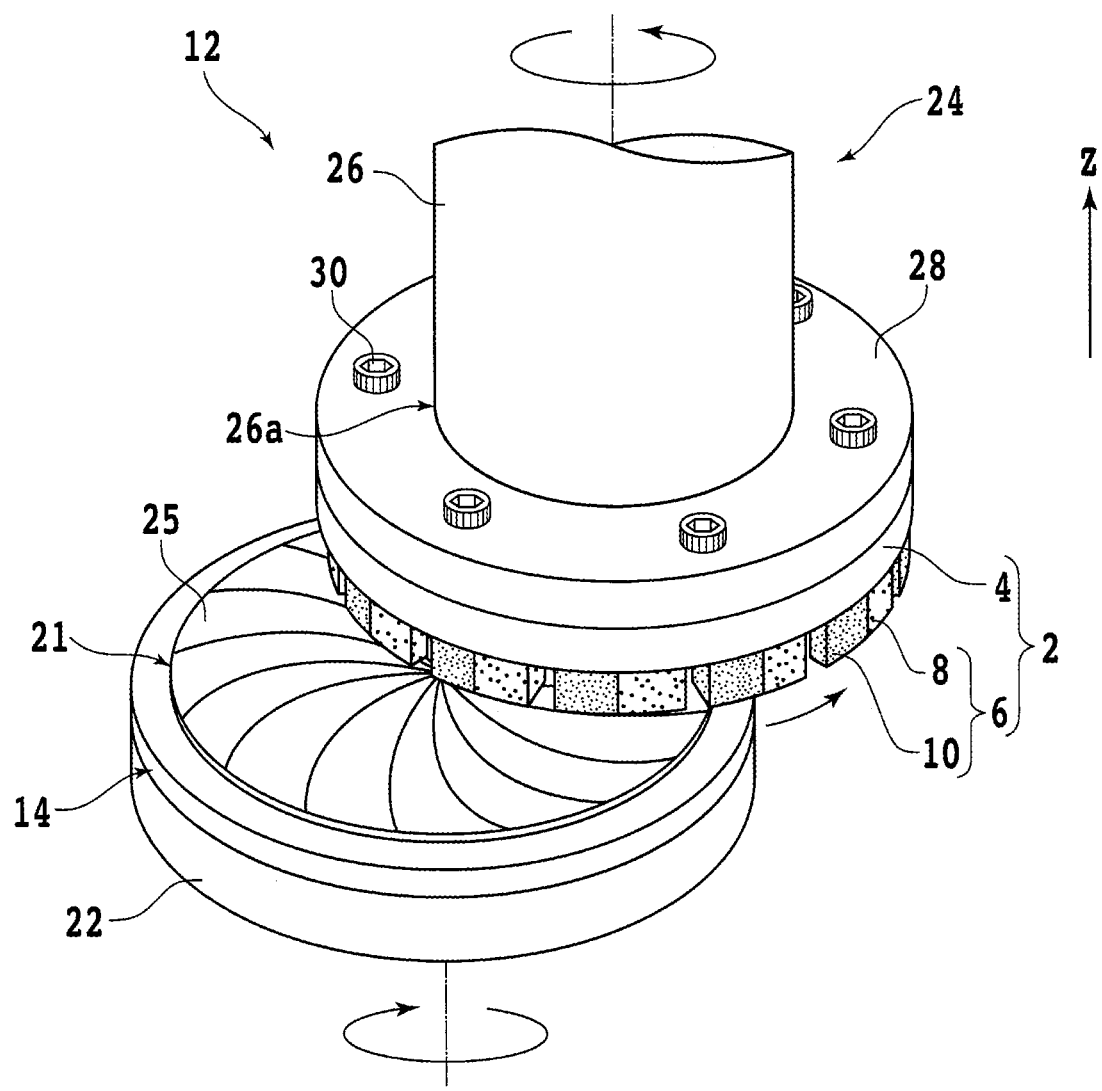
FIG. 9 is a diagram illustrating a first grinding step of the grinding method according to the second embodiment.

FIG. 8 is a diagram illustrating the holding step S10 according to the grinding method of the second embodiment of the present invention. Subsequent to the holding step S10, the first grinding step S20 is carried out. FIG. 9 is a diagram illustrating the first grinding step S20 of the grinding method according to the second embodiment of the present invention. In the first grinding step S20, the chuck table 14 is rotated in a predetermined direction at a predetermined value of 100 rpm or higher but 300 rpm or lower, and the spindle 26 is rotated in a predetermined direction at a predetermined value of 3000 rpm or higher but 4000 rpm or lower. Along with these rotational operations, the grinding unit 24 is fed for grinding at a processing feeding speed of a predetermined value of 0.1 µm/s or higher but 2.0 µm/s or lower, supplying the grinding water to the processing point. In the first grinding step S20, in each of the grindstone sets 6, in such a manner that the first grindstone 8 is set in front of the second grindstone 10, the spindle 26 and the grinding wheel 2 are rotated in a predetermined direction.

In the first grinding step S20, in order to grind a metal film that is likely to generate loading of the grindstones at a time of grinding due to its relative softness, and a silicon oxide film or a silicon nitride film that is likely generate glazing and shedding of the grindstone at a time of grinding due to its relative hardness, the film 25 is ground by effective use of the first grindstone 8 having a high self-sharpening capability due to its relative softness. Accordingly, it is possible to perform grinding on which the grinding characteristic of the first grindstone 8 is reflected. Specifically, it is possible to perform grinding on which the high self-sharpening capability of the first grindstone 8 is reflected.

In addition, in the first grinding step S20, it is also possible to grind the film 25 by use of the first grindstone 8 having the high self-sharpening capability and by use of the second grindstone 10 the self-sharpening of which is promoted by the abrasive grains 8b falling off. Note that, in the first grinding step S20, the wear amounts of the first grindstone 8 and the second grindstone 10 are substantially the same. In the first grinding step S20, the front surface 23a side is ground until the film 25 is removed, and the substrate 23 is exposed. Subsequent to the first grinding step S20, the second grinding step S30 is carried out.

In the second grinding step S30, first, the grinding unit 24 is raised to such an extent that the first grindstone 8 and the second grindstone 10 are not in contact with the workpiece 11. The rotational direction and the rotational speed of the chuck table 14 are kept at the same as those in the first grinding step S20. Then, in such a manner that the second grindstone 10 is set in front of the first grindstone 8 in each of the grindstone sets 6, the spindle 26 and the grinding wheel 2 are rotated at a predetermined value of 3000 rpm or higher but 4000 rpm or lower in a direction opposite to the predetermined direction in the first grinding step S20.

Figure 10:
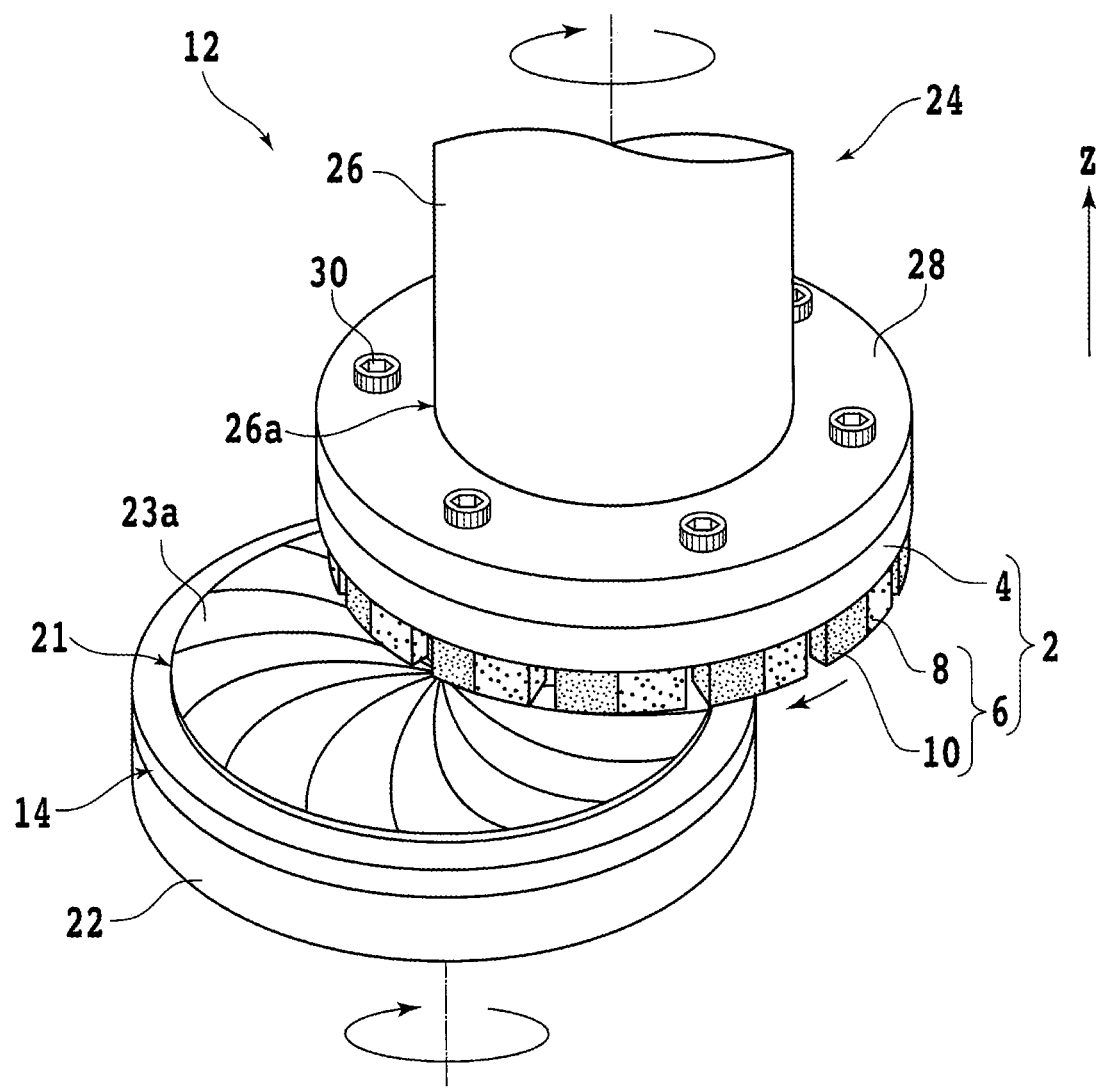
FIG. 10 is a diagram illustrating a second grinding step of the grinding method according to the second embodiment.

Thereafter, while the spindle 26 is rotated, the grinding unit 24 is fed for grinding at a processing speed of a predetermined value of 0.5 μm/s or higher but 2.0 μm/s or lower, supplying the grinding water to the processing point. FIG. 10 is a diagram illustrating the second grinding step S30 of the grinding method according to the second embodiment. In the second grinding step S30, processing feeding is carried out for a predetermined period of time, and the substrate 23 is ground to a predetermined finished thickness.

In the second grinding step S30, the second grindstone 10 in each of the grindstone sets 6 grinds mainly the front surface 23a. Hence, in the second grinding step S30, it is possible to perform grinding on which the grinding characteristic of the second grindstone 10 is reflected. Specifically, it is possible to grind the front surface 23a, reducing the wear amount of the grindstones. Note that, in the second grinding step S30, the first grindstone 8 traces the front surface 23a having been ground by the second grindstone 10. As a consequence, the wear amount of the first grindstone 8 is substantially the same as that of the second grindstone 10.

In the second embodiment, with use of the grinding wheel 2, changing the rotational direction of the spindle 26 allows for exercise of a high self-sharpening capability in the first grinding step S20 and makes it possible to reduce the wear amount of the grindstone in the second grinding step S30. In this manner, with use of one grinding wheel 2 mounted on one spindle 26, grinding similar to the grinding performed by use of two grinding wheels which have grinding characteristics different from each other can be performed on the workpiece 21. As a consequence, it is possible to prevent addition of the transferring step between the grinding apparatuses and an increase in footprint for the grinding apparatuses.

Next, with reference to FIG. 11A and FIG. 11B, a description regarding a modification of the first and second embodiments will be given. In the first and second embodiments described above, the rotational direction of the chuck table 14 is maintained and not changed. However, in the modification, a rotational direction of the chuck table 14 and inclination of the table base 22 are changed according to a rotational direction of the spindle 26 such that a manner of grinding is out-to-in grinding and inner edge grinding. The term, out-to-in grinding, refers to a manner of grinding in which the grindstones grind the workpiece from a peripheral portion of the workpiece to a center thereof. Note that the rotational direction of the chuck table 14 can be changed by the above driving mechanism, and the inclination of the table base 22 can be adjusted by the above inclination adjusting mechanism.

Figure 11A:
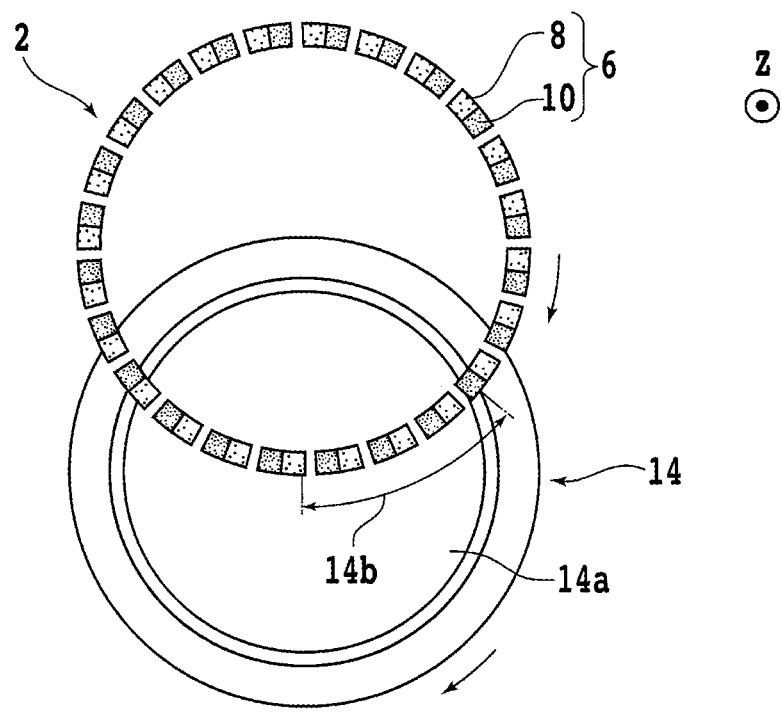
FIG. 11A is a diagram illustrating a correspondence relation between a rotational direction and a processing region of a chuck table, in a case in which a second grindstone is set in front of a first grindstone.

FIG. 11A is a diagram illustrating a correspondence relation between the rotational direction of the chuck table 14 and a processing region (partial region 14b) of the chuck table 14 being substantially parallel to the grinding surface, in a case in which the second grindstone 10 in each of the grindstone sets 6 is set in front of the first grindstone 8. However, in FIG. 11A, the workpiece on the holding surface 14a is not illustrated. In a top view of FIG. 11A, the rotational directions of the chuck table 14 and the grinding wheel 2 are substantially the same clockwise direction, and the partial region 14b is present in the right half of the holding surface 14a.

Figure 11B:
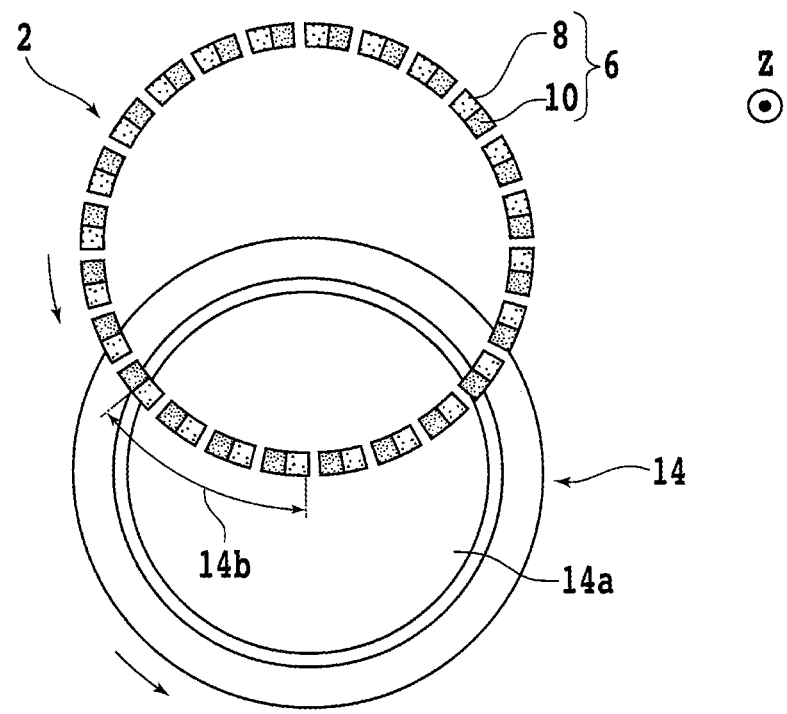
FIG. 11B is a diagram illustrating a correspondence relation between the rotational direction and the processing region of the chuck table, in a case in which the first grindstone is set in front of the second grindstone.

FIG. 11B is a diagram illustrating a correspondence relation between the rotational direction of the chuck table 14 and a processing region (partial region 14b) of the chuck table 14 being substantially parallel to the grinding surface, in a case in which the first grindstone 8 in each of the grindstone sets 6 is set in front of the second grindstone 10. However, in FIG. 11B, the workpiece on the holding surface 14a is not illustrated. In a top view of FIG. 11B, the rotational directions of the chuck table 14 and the grinding wheel 2 are substantially the same counterclockwise direction. In addition, the inclination of the table base 22 is different from the inclination thereof in FIG. 11A, and the partial region 14b is present in the left half of the holding surface 14a.

In the modification, according to the rotational direction of the spindle 26, the rotational direction of the chuck table 14 and the inclination of the table base 22 are changed, so that the manner of grinding can be maintained to be out-to-in grinding and inner edge grinding. Besides, a structure, a method, and the like according to the above embodiment may be appropriately modified, and various modifications can be implemented without departing from the scope of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A grinding method of grinding a workpiece having a single crystal substrate formed with a non-single crystal layer on a front surface of the substrate, with use of a grinding wheel,
    the grinding wheel including
        an annular base, and
        a plurality of grindstone sets disposed in an annular manner on one surface side of the base along a circumferential direction of the base,
    in which each of the plurality of grindstone sets has a first grindstone and a second grindstone having a self-sharpening capability lower than that of the first grindstone, such that the first grindstone and the second grindstone are adjacent to each other in a predetermined orientation in the circumferential direction of the base, and
    a predetermined interval larger than an interval between the first grindstone and the second grindstone in the circumferential direction of the base is provided between adjacent ones of the grindstone sets, the grinding method comprising:
a holding step of holding under suction, on a chuck table, a back surface of the substrate that is positioned opposite to the front surface of the substrate;
a first grinding step of rotating a spindle in a predetermined direction such that the second grindstone is set in front of the first grindstone in each of the grindstone sets, to grind the front surface of the substrate, thereby removing the non-single crystal layer, after the holding step is carried out; and
a second grinding step of rotating the spindle in a direction opposite to the predetermined direction such that the first grindstone is set in front of the second grindstone in each of the grindstone sets, to grind the substrate, after the first grinding step is carried out.

2. A grinding method of grinding a workpiece having a substrate formed with a film on a front surface of the substrate, with use of a grinding wheel,
the grinding wheel including
an annular base, and
a plurality of grindstone sets disposed in an annular manner on one surface side of the base along a circumferential direction of the base,
in which each of the plurality of grindstone sets has a first grindstone and a second grindstone having a self-sharpening capability lower than that of the first grindstone, such that the first grindstone and the second grindstone are adjacent to each other in a predetermined orientation in the circumferential direction of the base, and
a predetermined interval larger than an interval between the first grindstone and the second grindstone in the circumferential direction of the base is provided between adjacent ones of the grindstone sets,
the grinding method comprising:
a holding step of holding under suction, on a chuck table, a back surface of the substrate that is positioned opposite to the front surface of the substrate;
a first grinding step of rotating a spindle in a predetermined direction such that the first grindstone is set in front of the second grindstone in each of the grindstone sets, to grind the film, thereby removing the film, after the holding step is carried out; and
a second grinding step of rotating the spindle in a direction opposite to the predetermined direction such that the second grindstone is set in front of the first grindstone in each of the grindstone sets, to grind the substrate, after the first grinding step is carried out.

* * * * *